United States Patent [19]

Mack et al.

[11] Patent Number: 4,716,098

[45] Date of Patent: Dec. 29, 1987

[54] DEVELOPER FOR PREPARING PRINTING FORMS AND PROCESS THEREFOR

[75] Inventors: Gerhard Mack; Birgit Mueller, both of Wiesbaden; Guenter Jung, Taunusstein; Werner Frass, Wiesbaden, all of Fed. Rep. of Germany

[73] Assignee: Hoechst Aktiengesellschaft, Fed. Rep. of Germany

[21] Appl. No.: 790,153

[22] Filed: Oct. 23, 1985

[30] Foreign Application Priority Data

Oct. 30, 1984 [DE]  Fed. Rep. of Germany ....... 3439597

[51] Int. Cl.$^4$ ................................................. G03F 7/00
[52] U.S. Cl. .................................... 430/331; 252/156; 252/525; 252/544; 252/173; 252/174.14; 252/174.21; 252/174.22; 252/174.23; 252/174.24; 252/175; 430/302
[58] Field of Search ................. 430/331; 252/525, 544, 252/156, 173, 174.14, 174.21, 174.22, 174.23, 174.24, 175

[56] References Cited

U.S. PATENT DOCUMENTS

| | | | |
|---|---|---|---|
| 3,201,241 | 8/1965 | Munder et al. | 430/331 |
| 3,669,660 | 6/1972 | Golda et al. | 430/302 |
| 3,701,657 | 10/1972 | Moore et al. | 430/309 |
| 3,707,373 | 12/1972 | Martinson et al. | 430/331 |
| 3,867,147 | 2/1975 | Teuscher | 430/175 |
| 4,147,545 | 4/1979 | Rowe et al. | 430/331 |
| 4,186,006 | 1/1980 | Kobayashi et al. | 430/302 |
| 4,308,340 | 12/1981 | Walls | 430/331 |
| 4,339,530 | 7/1982 | Sprintschnik et al. | 430/331 |
| 4,350,756 | 9/1982 | Burch et al. | 430/331 |
| 4,395,480 | 7/1983 | Sprintschnik | 430/309 |

FOREIGN PATENT DOCUMENTS

| | | |
|---|---|---|
| 0080042 | 6/1983 | European Pat. Off. . |
| 033232 | 6/1984 | European Pat. Off. . |
| 1515174 | 7/1975 | United Kingdom . |
| 2110401 | 6/1983 | United Kingdom . |

*Primary Examiner*—Charles L. Bowers, Jr.
*Attorney, Agent, or Firm*—Schwartz, Jeffery, Schwaab, Mack, Blumenthal & Evans

[57] ABSTRACT

A developer for negative-working reproduction layers and process therefor. The developer includes water, an organic solvent, a surface-active agent, an alkaline agent, a complexing agent, a buffer substance, an emulsifier and an n-alkanoic compound. Use of the developer suppresses speck and fibril formation in the developing process, and can be used in reproduction layers which optionally contain a binder.

18 Claims, No Drawings

DEVELOPER FOR PREPARING PRINTING FORMS AND PROCESS THEREFOR

BACKGROUND OF THE INVENTION

The invention relates to a developer mixture which is suitable for developing negative-working exposed reproduction layers in copying materials, to a process for preparing printing forms, and to the use of the developer.

Copying materials of the stated kind are used in particular in the preparation of printing plates or photoresists and comprise a base and a negative-working light-sensitive reproduction layer. The bases used in these copying materials are metals such as zinc, chromium, copper, brass, steel, aluminum or combinations of these metals, plastic films, paper or similar materials. These bases can be coated with the light-sensitive reproduction layer without a modifying pretreatment, but preferably are first subjected to a surface modification such as a mechanical, chemical or electrochemical roughening, an oxidation and/or a treatment with hydrophilizing agents (for example in the case of offset printing plate bases). The reproduction layers to be developed according to the invention contain water-insoluble diazonium salt polycondensation products. In addition to the light-sensitive component, the reproduction layers can also contain plasticizers, pigments, dyes, wetting agents, sensitizers, indicators and other customary additives. Such reproduction layers are exhaustively described for example in U.S. Pat. No. 3,867,147.

A developer for negative-working reproduction layers must be able to dissolve those parts of the layer which have not been exposed to electromagnetic radiation (the latent nonimage areas) out of the exposed layer without significantly affecting those parts of the layer which have been exposed to the radiation (the latent image areas). Electromagnetic radiation can be, for example, visible light. The above-cited patent mentions as generally suitable developers: water, water/organic solvent mixtures, aqueous salt solutions, aqueous acid solutions, aqueous-alkaline solutions and undiluted organic solvents, to which surfactants and/or hydrophilizing agents may be added. The developers chiefly used in the examples contain water, sodium lauryl sulfate, sodium sulfate, tartaric acid and in some cases benzyl alcohol; other developers contain or comprise isopropanol, n-propanol, n-propyl acetate, polyacrylic acid, 1,1,1-trichloroethane, acetone or ethylene glycol monomethyl ether.

The prior art additionally discloses the following developers and developer mixtures:

German Auslegeschrift No. 1,047,016 describes the addition of 3 to 5% by weight of propylene oxide/ethylene oxide block polymers having terminal ethylene oxide units to an aqueous developer which contains phosphoric acid and is used for light-sensitive colloid layers which are on planographic printing plates and contain diazonium compounds.

The aqueous, alkaline developers of U.S. Pat. No. 3,201,241 for negative layers on planographic printing plates contain 0.3 to 5% of alkali, 0.001 to 0.05% of certain cations such as $Ca^{2+}$, $Sr^{2+}$, or $Ba^{2+}$, 0.001 to 0.25% by weight of complexing agents such as tartaric acid, ascorbic acid or ethylenediaminetetraacetic acid and 0.2 to 0.8% by weight of water-soluble polymers such as polyethylene glycols or cellulose ethers. If the negative layers which contain p-quinonediazides as the light-sensitive compound also contain binders, the developer generally has added to it also organic solvents such as ethylene glycol monomethyl ether.

U.S. Pat. No. 3,701,657 discloses a non-aqueous developer, for planographic printing plates with a photopolymerizable resin, which contains an organic solvent, a low-molecular surfactant and if desired, as hydrophilizing agent, a low-molecular acid such as citric acid or phosphoric acid or a hydrophilic colloid such as carboxymethylcellulose. Surfactants which are mentioned as suitable are, inter alia, alkylarylsulfonic acids and polycondensation products of ethylene oxide and alcohols, fatty alcohols, alkylphenols or fatty amines.

The developer for negative layers as described in U.S. Pat. No. 3,669,660 contains water and a water-soluble sulfonic acid (in particular aromatic compounds) or one of its water-soluble salts and if desired a water-soluble organic solvent, a surfactant and an acid such as phosphoric acid. The light-sensitive layers to be developed are said to be based on p-diazodiphyenylamine. The developer contains the sulfonic acid compound in a proportion of 5 to 25% by weight, the organic solvent in a proportion of 0 to 20% by weight, up to 5% by weight of the surfactant (for example sodium lauryl sulfate) and up to 5% by weight of the acid.

U.S. Pat. No. 4,147,545 describes a developer for negative layers which contains a water-soluble lithium salt of an organic compound with at least one acidic hydrogen atom and if desired an amphoteric surfactant. Suitable lithium salts include, inter alia, lithium-dodecanoate, -lauryl sulfonate, -chloroacetate, -caprylate, -stearate and -oleate, and they are added to the aqueous solution in a proportion of 1 to 25% by weight. The amphoteric surfactant can be present in the developer in a proportion of up to 50% by weight. The developer can in addition contain up to 30% by weight of an organic solvent, up to about 10% by weight of an nonionic surface-active agent and up to 5% by weight of phosphoric acid or oxalic acid. The light-sensitive layer to be developed is based on water-insoluble diazonium compounds or on photo-polymerizable compounds.

The amphoteric surfactants contain not only a grouping having a basic nitrogen atom but also a grouping having an acid function, such as a carboxyl, sulfate, sulfonate or phosphate radical. A further addition can also comprise ionic or nonionic surfactants in a proportion of 5 to 10% by weight. Those mentioned include, inter alia, polyethylene glycol ethers of alcohols or alkylphenols.

The developer which is described in British Patent No. 1,515,174 for treating negative layers containing diazonium salt polycondensation products contains a major proportion of water, a smaller amount of an organic solvent and a water-soluble colloid. Such a developer can also contain up to 10% by weight of a surfactant and up to 20% by weight of a salt or an acid (inter alia sulfates, phosphates, nitric acid, phosphoric acid); surfactants mentioned as suitable are, inter alia, sodium lauryl sulfate, alkyl polyethylene glycol ethers and alkylphenol polyethylene glycol ethers.

U.S. Pat. No. 4,186,006 discloses a developer, for light-sensitive layers containing a water-insoluble diazo resin and a hydrophobic resin, which contains (a) benzyl alcohol, ethylene glycol monophenyl ether or monobenzyl ether, (b) an anionic surfactant and (c) a water-soluble sulfite.

European Patent Application No. 0,056,138 discloses a process and a developer mixture for developing exposed negative-working diazonium salt layers which is composed of water, a salt of an alkanoic acid and a nonionic surfactant. In the mixture, the stated constituents are said to be in a specified ratio to each other.

European Pat. No. 0,033,232 describes a process for developing an imagewise-exposed, negative-working planographic printing from material with an essentially aqueous developer which contains a nonionic surfactant and additionally a salt of an aliphatic carboxylic acid having up to 9 carbon atoms.

European Patent Application No. 0,080,042 concerns a developer for removing the unexposed areas of light-sensitive coatings which contain a high-molecular polymer. The developer contains a surface-active agent, organic solvent, an alkaline agent, for example alkaline salts, amines or imines, and 0.01 to 5.0% by weight of a water-softening agent.

British Pat. No. 2,110,401 discloses a developer which comprises a water-miscible solvent for the binder and water and a mixture of a hydrophilic anionic surface-active agent and an organophilic nonionic surface-active agent.

European Pat. No. 0,004,014 discloses a developer solution which is intended for developing exposed light-sensitive copying layers containing a diazonium salt polycondensation product and a water-insoluble organic polymer, which comprises a buffered aqueous solution of a water-soluble polymer, an anionic wetting agent and a water-miscible organic solvent. The solution has a pH of from 3 to 9, and contains 0.5 to 15% by weight of anionic wetting agent as the water-soluble polymer, 0.5 to 6% by weight of poly-N-vinylmethylacetamide or 1 to 5% by weight of polyvinyl alcohol, 0.5 to 6% by weight of a salt or salt mixture which stabilizes the pH within the indicated range, from 0.5% by weight to saturation concentration of benzyl alcohol and from 0.5% by weight to a saturation concentration of glycerol triacetate.

German Offenlegungsschrift No. 2,941,960 describes a developer mixture which is intended for washing away imagewise-exposed light-sensitive copying layers containing a polymer of an N-vinylamine, vinyl alcohol or a vinyl alcohol derivative, an alcohol which is soluble in water to less than 10% by weight, and water as the main component. The mixture comprises a copolymer which is water-soluble, or dispersible in water to form a stable dispersion, from
(a) hydrophilic units of the formula I

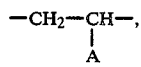

in which
A denotes

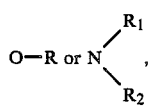

R denotes a hydrogen atom or a methyl group,
$R_1$ denotes a hydrogen atom, an alkyl group or an alkoxyalkyl group each having 1 to 10 carbon atoms or an aryl group having 6 to 10 carbon atoms,
$R_2$ denotes an alkyl group or an acyl group each having 1 to 5 carbon atoms,
and where a homopolymer of the hydrophilic units is water soluble and
(b) hydrophobic units of vinyl monomers, whose homopolymer is water-insoluble and which have as a substituent an aromatic or a long-chain aliphatic radical, the proportion of hydrophobic units being sufficiently high that a 0.1% strength solution of the copolymer has a surface tension of no more than 50 mN/m. The amount of copolymer is at least sufficient to emulsify any alcohol present in excess of the solubility limit.

However, the developers or developer mixture disclosed by the cited state of the art have in particular the following disadvantages:

They frequently contain higher proportions of organic solvents which, for ecological reasons (low-boiling, flammable, unpleasant odor, adverse effect on waste water and exhaust air, expensive precautions for removing the solvent after the developing), should ideally no longer be present in up-to-date developers.

It is true that lauryl sulfate, heretofore frequently used in practice, or other alkanesulfates or alkanesulfonates as such, are active developer components for the indicated light-sensitive reproduction layers, but they require a relatively long development time, they give rise to excessive foaming in processing machines, in particular in the case of vertical development, and the solubility at low temperatures (for example from about 10° C. and lower) in water drops to such an extent that fall or winter temperatures can give rise in the stock solutions to flaky residues which are frequently troublesome to the converters. Grease spots and adhesive residues of the type which can arise in the handling of offset printing plates under practical conditions are removed by these developer components if at all only after a long treatment time and by means of additional mechanical aids.

It is true that they are indeed suitable for use for the specific reproduction layers for which they were developed and for which they have indeed been successfully used in the respective examples, but in the case of layers other than these specific reproduction layers they exhibit more or less sizeable problems; i.e. they are not universally applicable.

They are not suitable for generally suppressing the impurities (specks and fibrils) which arise in many cases, chiefly in the case of automatic development, as redeposits on the printing forms, so that it is impossible to obtain quality end products, even on prolonged use of the developer.

SUMMARY OF THE INVENTION

It is accordingly an object of the present invention to provide a developer for negative-working exposed reproduction layers which, in addition to having optimal developing properties (high resolution of the nonimage areas and no attack on the image areas), gives rapid development for use in automatic processing equipment.

It is another object of the invention to provide a developer, as above, which develops without forming specks or fibrils and has a high yield, i.e. has usable developing properties even over a prolonged period without forming impurities.

It is yet another object of the invention to provide a developer, as above, which can be used not only with binder-containing systems but also with binder-free systems.

These objects are achieved by a developer mixture for developing a negative-working exposed reproduction layer located on a base, comprising: water, at least one organic solvent, at least one alkaline agent, at least one complexing agent, at least one surface-active agent, at least one emulsifier, at least one n-alkanoic compound, and at least one buffer substance. The surface-active agent has an anionic structure. The n-alkanoic compound is selected from n-alkanoic acids, salts, and mixtures thereof.

The objects of the invention are further achieved by a process for preparing a printing form, comprising the steps of: applying to a base a negative-working layer which contains diazonium salt, subjecting the layer to imagewise exposure, and subsequently treating the layer with the above-described developer. The emulsifier, alkanoic compound, and buffer substance are added to the developer mixture either before or during the treatment step.

DETAILED DESCRIPTION OF THE PREFERRED EMBODIMENTS

The present invention is an improvement on the state of the art as described in European Patent Application No. 0,080,042. The developer of the invention is intended for developing a negative-working exposed reproduction layer present on a base, and includes a mixture of water, at least one organic solvent, at least one alkaline agent, at least one complexing agent and at least one surface-active agent. The surface-active agent has an anionic structure. The mixture additionally includes at least one emulsifier and at least one n-alkanoic acid and/or salts thereof and at least one buffer substance.

Even though the developer components are known from the state of the art as individual species or in some cases as members of combinations, it was nonetheless surprising that the developer composition according to the invention satisfactorily achieved the stated objects in all respects.

In a preferred embodiment, the employed n-alkanoic acid and/or its salts have 8 to 12 carbon atoms and are present in the mixture in amounts of from about 1.0 to about 7.0%, in particular from about 1.5 to about 6.0% by weight. Particularly good results are obtained with caprylic, pelargonic, capric and lauric acid. The complexing agent content in the mixture is preferably from about 0.5 to about 9.0%, in particular from about 1.0 to about 4.0% by weight. Even though, in principle, all customary complexing agents can be used in the developer, polyphosphates, and particularly metaphosphates, such as, for example, Kurrol, Madrell and Graham, are preferred. Good results are also obtained with alkali metal salts, for example sodium salts, of nitrilotriacetic acid and ethylenediamine-tetraacetic acid.

The anionic surface-active agent or agents are used in the mixture in amounts of from about 0.2 to about 12.0% preferably from about 1.0 to about 8.0% by weight. Although many anionic surface-active agents can be used, preference is given to alkali metal octyl sulfates, alkali metal salts of dodecylsulfonic acid, alkylphenol ether sulfates, alkali metal sulfosuccinates, alkyl ether phosphates, alkali metal oleic acid methyl tauride and condensed naphthalenesulfonates. A preferred alkali metal is sodium.

The preferred emulsifier content in the developer mixture is from about 0.5 to about 10.0%, preferably from about 1.0 to about 6.0% by weight. The emulsifiers used are mainly products selected from poly-N-vinyl-N-methylacetamide, water-soluble copolymers of N-vinyl-N-methylacetamide, polyvinyl alcohol, dextrin, gum arabic and cellulose ether, in particular carboxymethylcellulose.

The proportion of organic solvent in the mixture is advantageously from about 0.5 to about 13.0%, preferably from about 1.0 to about 8.0% by weight. Numerous known organic solvents can be used, but it has been found in practice that benzyl alcohol, ethylene glycol monophenyl ether, 1-phenylethanol, 2-phenylethanol and propylene glycol monomethylether are particularly suitable.

Suitable buffering systems are in principle all those which are preferentially active within the pH range from about 8 to about 12. However, preference is given to the use of the generally accessible substances from the group consisting of carbonates, phosphates, borates, alkali metal salts of glycine and amines, of which preferably diethanolamine and triethanolamine are used. Highly utilizable buffer systems are for example mixtures of carbonate/hydrogencarbonate, phosphate/hydrogenphosphate and the like. The aqueous proportion preferably comprises deionized water. The proportion of buffer in the mixture is from about 0.5 to about 20.0% by weight, with from about 1.0 to about 10% by weight preferred.

The developer according to the invention is basically utilizable for all negative-working reproduction layers of the type which form the state of the art. These reproduction layers can either contain known binders, or can be binder-free. Preferably, however, the developer is used in the case of binder-containing reproduction layers, most preferably those which contain diazonium salts.

The developer according to the invention has been found to be particularly useful in the case of those reproduction layers which are described in unpublished German Patent Application No. P 34 04 366.7, assigned to Hoechst AG, and which essentially concern a light-sensitive mixture which contains a diazonium salt polycondensation product and a non-light-sensitive polymeric binder containing pendant carboxyl groups, which is soluble or at least swellable in aqueous alkali solution and which is a reaction product of an intramolecular anhydride of an organic polycarboxylic acid with a hydroxyl-containing synthetic polymer which contains no further functional groups capable of reaction with acid anhydrides.

As a consequence of the fact that only relatively small proportions of organic solvents are present in the developer mixture, the composition of the developer mixture remains virtually unchanged during use and thus the developer mixture has a comparatively long service life in the developing apparatus. In general, the pH of the developer mixture according to the invention is preferably from about 8 to about 12. The developer mixture is not an odor nuisance, and even at temperatures around the freezing point there are no precipitates within the claimed quantitative range of the components. Adhesive residues (for example from gluing on the film originals when copying) and grease spots (for example from die-cutting the printing plates) can be effortlessly removed, even if the developer is allowed to act for only a short time. The rate of development is higher than that of conventional developers without noticeable deterioration in the developer resistance of the image areas. Even the salts of the alkanoic acids, as relatively short-chain "soaps", can be broken down comparatively easily.

In addition to the stated advantageous properties, it is a further surprising advantage of the developer according to the invention that the formation of specks and fibrils, which leads to undesirable impurities in the completed product and on the processing equipment, is suppressed.

In the developing of reproduction materials, the developer, rinsing and gumming stations are customarily connected in series. As the concentration of layer components in the developer increases, developing gets slower and incomplete. During rinsing it is virtually impossible to avoid active constituents being removed from the developer. For instance, the surface of the reproduction material adsorbs layer constituents, for example in agglomerated form, which become noticeable as undesirable contaminants. In particular in the case of hard water, the calcium ions present can have the effect of crosslinking any binders having acid groups into sparingly soluble ionic addition products. The adsorbed layer components are not dissolved by the preserving solution but are lifted from the surface of the base as a skin. The developer according to the invention is universally applicable even if the mixing water used has different degrees of hardness. That is particularly important, since the developer mixtures are prepared at locations which differ in water hardness.

The invention also relates to a process for preparing a printing form by applying to a base, preferably a base made of aluminum or its alloys and which has in particular been pretreated with any one or a combination of mechanical, chemical, electrochemical or hydrophilizing pretreatments, a negative-working layer which may contain diazonium salts and/or binders, subjecting the layer to imagewise exposure, and then treating the layer with a developer comprising water, at least one organic solvent, at least one alkaline agent, at least one complexing agent and at least one surface-active agent, which comprises adding to the developer, before and/or during the treatment, at least one anionically structured surface-active agent, at least one emulsifier, at least one n-alkanoic acid and/or its salts, and at least one buffer substance.

The treatment within the process is preferably carried out with a developer which has the composition described above.

The invention is described in more detail in the following examples without, however, implying any limitation to the specific embodiments described.

EXAMPLE 1

An electrochemically roughened aluminum foil in sheet form which had been anodically oxidized and treated with an aqueous solution of polyvinylphosphonic acid was coated with a solution of 100 parts by weight of ethylene glycol monomethyl ether, 50 parts by weight of tetrahydrofuran, 0.4 part by weight of crystal violet, 0.2 part by weight of 85% strength phosphoric acid and 2 parts by weight of a polycondensation product prepared from 1 mol of 3-methoxydiphenylamine-4-diazonium sulfate and 1 mol of 4,4'-bis-methoxymethyl-diphenyl ether in 85% strength phosphoric acid, isolated as mesitylene sulfonate) in such a way that the weight of the layer after drying was 0.4 g/m². The light-sensitive offset printing plate was imagewise-exposed and was developed with a developer comprising 77.0% by weight water, 3.0% by weight ethylene glycol monophenyl ether, 2.0% by weight Graham salt, 2.0% by weight polyvinylmethylacetamide, 4.0% by weight pelargonic acid, 1.0% by weight solid KOH and 3.0% by weight triethanolamine. The developing time was in accordance with practical requirements, the nonimage areas being cleanly developed. No speck or fibril formation was observed. Even when the developer was used in a conventional machine for the developing and preparing of a printing form with intermediate rinse and gumming, no such faults were found. In an offset printing machine, it is possible to produce from the developed plate several thousand satisfactory prints.

EXAMPLE 2

Example 1 was repeated, except that the coating solution used comprised:

62 p.b.w. of a polymer prepared by refluxing using a polyvinyl butyral having a molecular weight of about 70 to 80,000, which contained 71% vinyl butyral, 2% vinyl acetate and 27% vinyl alcohol units, maleic anhydride, methyl ethyl ketone and trimethylamine, 21 p.b.w. of a diazonium salt polycondensation product prepared from 1 mol of 3-methoxy-diphenylamine-4-diazonium sulfate and 1 mol of 4,4'-bis-methoxymethyldiphenyl ether in 85% strength phosphoric acid and isolated as mesitylenesulfonate, 2.5 p.b.w. of phosphoric acid (85%), 3 p.b.w. of Victoria Pure Blue FGA (C.I. Basic Blue 81) and 0.7 p.b.w. of phenylazodiphenylamine in 2570 parts by weight of ethylene glycol monomethyl ether and 780 p.b.w. of tetrahydrofuran.

The copying layer thus obtained, which after drying had a weight of 0.95 g/m², was exposed underneath a negative original with a metal halide lamp of 5 kW output for 30 seconds.

The developer of Example 1 was used. Correspondingly good results were obtained.

EXAMPLES 3 TO 6

Examples 1 and 2 were repeated, except that the n-alkanoic acid used in the developer included both caprylic acid and lauric acid. Similarly favorable results as in Examples 1 and 2 were obtained.

EXAMPLES 7 TO 29

Table I summarizes compositions for these examples. When the developer compositions listed were used for developing the layers mentioned in Examples 1 and 2, the excellent results of Examples 3 to 6 were confirmed.

TABLE I

| Developer composition (% by weight) | | | | | | |
|---|---|---|---|---|---|---|
| Example | 7 | 8 | 9 | 10 | 11 | 12 |
| Dodecylbenzenesulfonic acid/sodium salt | 2.0 | 2.0 | — | 2.5 | — | — |
| $K_2CO_3$ | 1.5 | 1.5 | 1.5 | 1.2 | 1.5 | 1.5 |
| $KHCO_3$ | 1.5 | 1.5 | 1.5 | 1.2 | 1.5 | 1.5 |
| Ethylene glycol monophenyl ether | 3.0 | 3.0 | 3.0 | 2.5 | 3.0 | 3.0 |
| Graham salt | — | — | 2.0 | 1.5 | 2.0 | 2.0 |
| Poly-N—vinyl-N—methylacetamide | 2.0 | 2.0 | 2.0 | 1.8 | 2.0 | 2.0 |
| Pelargonic acid | 4.0 | 4.0 | 4.0 | 2.8 | 2.8 | 4.0 |
| KOH solid | 1.0 | 1.0 | 1.0 | 1.0 | 1.0 | 1.0 |
| Nitrilotriacetic acid | 2.0 | — | — | — | — | — |
| Ethylenediaminetetraacetic acid/sodium salt | — | 2.0 | — | — | — | — |

TABLE I-continued

| Developer composition (% by weight) | | | | | | |
|---|---|---|---|---|---|---|
| Sodium octyl sulfate | — | — | 2.0 | — | — | — |
| Alkylphenol ether sulfate (Hostapal$^{(R)}$ BV) | — | — | — | — | 2.0 | — |
| Sodium sulfosuccinate (Rewopol$^{(R)}$ SFB) | — | — | — | — | — | 2.0 |
| Deionized water | ad 100% | | | | | |

| Example | 13 | 14 | 15 | 16 | 17 | 18 |
|---|---|---|---|---|---|---|
| Dodecylbenzenesulfonic acid/sodium salt | — | — | — | 2.0 | 2.0 | 2.0 |
| K$_2$CO$_3$ | 1.5 | 1.5 | 1.5 | — | — | — |
| KHCO$_3$ | 1.5 | 1.5 | 1.5 | — | — | — |
| Ethylene glycol monophenyl ether | 3.0 | 3.0 | 3.0 | 3.0 | 3.0 | 3.0 |
| Graham salt | 2.0 | 2.0 | 2.0 | 2.0 | 2.0 | 2.0 |
| Poly-N—vinyl-N—methylacetamide | 2.0 | 2.0 | 2.0 | 2.0 | 2.0 | 2.0 |
| Pelargonic acid | 4.0 | 4.0 | 4.0 | 4.0 | 4.0 | 4.0 |
| KOH solid | 1.0 | 1.0 | 1.0 | 1.4 | 1.4 | 1.4 |
| Alkyl ether phosphate (Forlanon$^{(R)}$ T) | 2.0 | — | — | — | — | — |
| Sodium oleic acid methyl tauride (Arcopon$^{(R)}$ SN) | — | 2.0 | — | — | — | — |
| Condensed naphthalenesulfonate (Orotan$^{(R)}$ SN) | — | — | 2.0 | — | — | — |
| Na$_3$PO$_4$.12 H$_2$O | — | — | 1.25 | — | — | — |
| K$_2$B$_4$O$_7$.4 H$_2$O | — | — | — | 1.0 | — | — |
| Glycine/potassium salt | — | — | — | — | — | 1.61 |
| Deionized water | ad 100% | | | | | |

| Example | 19 | 20 | 21 | 22 | 23 |
|---|---|---|---|---|---|
| Sodium octyl sulfate | 8.0 | — | — | — | — |
| Ethylene glycol monophenyl ether | 5.0 | — | — | — | — |
| Graham salt | 2.0 | 2.0 | 2.5 | 2.5 | 2.0 |
| Poly-N—vinyl-N—methylacetamide | 2.0 | 2.0 | 1.5 | 1.5 | 2.0 |
| Pelargonic acid | 4.0 | 4.0 | 2.8 | 2.8 | 4.0 |
| KOH solid | 1.0 | 1.0 | 1.0 | 1.0 | 1.0 |
| Triethanolamine | — | — | — | — | — |
| Diethanolamine | 1.0 | — | — | — | — |
| Dodecylbenzenesulfonic acid sodium salt | — | 2.0 | 1.5 | 1.5 | 2.0 |
| K$_2$CO$_3$ | — | 1.5 | 1.0 | 1.0 | 1.5 |
| KHCO$_3$ | — | 1.5 | 1.0 | 1.0 | 1.5 |
| Benzyl alcohol | — | 3.0 | — | — | — |
| 1-Phenylethanol | — | — | 2.5 | — | — |
| 2-Phenylethanol | — | — | — | 2.5 | — |
| Propylene glycol monomethyl ether | — | — | — | — | 3.0 |
| Deionized water | ad 100% | | | | |

| Example | 24 | 25 | 26 | 27 | 28 | 29 |
|---|---|---|---|---|---|---|
| Sodium octyl sulfate | 2.0 | — | 2.0 | 2.0 | — | — |
| K$_2$CO$_3$ | 1.5 | 1.5 | 1.5 | 1.5 | 1.5 | 1.5 |
| KHCO$_3$ | 1.5 | 1.5 | 1.5 | 1.5 | 1.5 | 1.5 |
| Ethylene glycol monophenyl ether | 3.0 | 3.0 | 3.0 | 3.0 | 3.0 | 3.0 |
| Graham salt | 2.0 | 2.0 | 2.0 | 2.0 | 2.0 | 2.0 |
| Dextrine | 2.0 | — | — | — | — | — |
| Polyvinyl alcohol | — | 2.0 | — | — | — | — |
| Carboxymethylcellulose | — | — | 2.0 | — | — | — |
| Gum arabic | — | — | — | 2.0 | — | — |
| Pelargonic acid | 4.0 | 4.0 | 4.0 | 4.0 | — | — |
| KOH solid | — | 1.0 | — | — | 1.0 | 1.0 |
| NaOH solid | 1.0 | — | 1.0 | 1.0 | — | — |
| Dodecylbenzenesulfonic acid/sodium salt | — | 2.0 | — | — | 2.0 | 2.0 |
| Poly-N—vinyl-N—methylacetamide | — | — | — | — | 2.0 | 2.0 |
| Caprylic acid | — | — | — | — | 2.5 | — |
| Capric acid | — | — | — | — | — | 3.0 |
| Deionized water | ad 100% | | | | | |

The developer composition of Examples 1 and 3 to 29 were tested on reproduction layers prepared from the following solutions:

A.
1.5% by weight of diazonium salt polycondensation product from 3-methoxydiphenylamine-4-diazonium sulfate and formaldehyde,
1.5% by weight of binder from a reaction product of polyvinyl butyral and maleic anhydride,
0.1% by weight of Victoria Pure Blue FGA (C.I. Basic Blue 81),
0.1% by weight of 85% strength phosphoric acid,
96.8% by weight of ethylene glycol monomethyl ether.
After drying, the weight of the layer was 0.8 g/m$^2$.

B.
1.5% by weight of styrene/maleic anhydride copolymer half-ester (Scripset 540 from Monsanto),
1.5% by weight of diazonium salt polycondensation product from 1 mol of 3-methoxydiphenylamine-4-diazonium sulfate and 1 mol of 4,4'-bis-methoxymethyldiphenyl ether, precipitated as mesitylenesulfonate,
0.1% by weight of 85% strength phosphoric acid,
0.1% by weight of Victoria Pure Blue FGA (C.I. Basic Blue 81),
96.8% by weight of ethylene glycol monomethyl ether.
After drying, the weight of the layer was 0.6 g/m$^2$.

C.
97.0 p.b.w. of a polymer prepared by reacting 11.3% by weight of the polyvinyl butyral mentioned in Example 2 in tetrahydrofuran with 5.11% by weight of propenylsulfonyl isocyanate in tetrahydrofuran,
48.3 p.b.w. of the diazonium salt polycondensation product mentioned in Example 2,
4.8 p.b.w. of 85% strength phosphoric acid,
3.5 p.b.w. of Victoria Pure Blue FGA (C.I. Basic Blue 81),
1.6 p.b.w. of phenoldiphenylamine in 3500 parts by weight of ethylene glycol monomethyl ether and
1036 p.b.w. of tetrahydrofuran.
After drying, the weight of the layer was 0.73 g/m$^2$.

D.
2 p.b.w. of a partially alkanol-esterified styrene/maleic anhydride copolymer having an average molecular weight of 20,000 and an acid number of around 200,
2 p.b.w. of a diurethane, prepared by reacting glycerol dimethacrylate with hexamethylene diisocyanate,
0.125 p.b.w. of 9-phenylacridine,
0.05 p.b.w. of a blue dye obtained by coupling 2,4-dinitro-6-chlorobenzenediazonium salt with 2-methoxy-5-acetylamino-n-cyanoethyl-N-hydroxyethyl-aniline in
25.0 p.b.w. of butanone and
12.0 p.b.w. of butyl acetate.
After drying, the weight of the layer was 3.7 g/m$^2$.

The excellent results agree with those of the preceding examples. In this instance too it was surprising to obtain the high combination effect according to the invention of rapid and satisfactory development, high service life of the developer combined with substantial invariance in composition, the utility for high-speed development machines, the substantial ecological acceptability and the absolute avoidance of speck and fibril formation on a wide variety of different reproduction layers.

Comparisons which have been carried out showed that the omission of only one component in the developer composition according to the invention leads to unsatisfactory results in terms of slow and/or insufficient development and consequently to nonutility in the customary developing stages and the inability to suppress speck and fibril formation. The end products were correspondingly of inferior quality.

What is claimed is:

1. A developer mixture for developing a negative-working exposed reproduction layer provided on a base, said mixture comprising water; from about 0.5 to about 13.0% by weight of at least one organic solvent; at least one alkaline agent; about 0.5 to about 9.0% by weight of at least one complexing agent; from about 0.2 to about 12.0% by weight of at least one surface-active agent; from about 0.5 to about 10.0% by weight of at least one emulsifier; about 1.0 to about 7.0% by weight of at least one n-alkanoic compound; and from about 0.5 to about 20.0% by weight of at least one buffer substance, said percentages by weight being based on the total weight of said developer mixture, wherein (A) said surface-active agent has an anionic structure and (B) said n-alkanoic compound is selected from an n-alkanoic acid, an n-alkanoic acid salt, and mixture thereof.

2. The developer as claimed in claim 1, wherein said n-alkanoic compound has from 8 to 12 carbon atoms.

3. The developer as claimed in claim 1, wherein the n-alkanoic compound content in said mixture is from about 1.5 to about 6.0% by weight.

4. The developer as claimed in claim 1, wherein said complexing agent is present in said mixture in amounts of from about 1.0 to about 4.0% by weight.

5. The developer as claimed in claim 1, wherein said anionic surface-active agent is present in said mixture in amounts of from about 1.0 to about 8.0% by weight.

6. The developer as claimed in claim 1, wherein said emulsifier is present in said mixture in amounts of from about 1.0% to about 6.0% by weight.

7. The developer as claimed in claim 1, wherein said organic solvent is present in said mixture in amounts of from about 1.0 to about 8.0% by weight.

8. The developer as claimed in claim 1, wherein said buffer is present in said mixture in amounts of from about 1.0 to about 10.0% by weight.

9. The developer as claimed in claim 1, wherein said n-alkanoic compound is selected from the group consisting of caprylic, pelargonic, capric and lauric acid.

10. The developer as claimed in claim 1, wherein said at least one complexing agent is selected from the group consisting of a polyphosphate, an alkali metal salt of nitrilotriacetic acid and an alkali metal salt of ethylenediaminetetraacetic acid.

11. The developer as claimed in claim 1, wherein said polyphosphate is a metaphosphate.

12. The developer as claimed in claim 1, wherein said at least one anionic surface-active agent is selected from the group consisting of an alkali octylsulfate, an alkali metal salt of dodecylsulfonic acid, an alkylphenol ether sulfate, an alkali sulfosuccinate, an alkyl ether phosphate, an alkali oleic acid methyl tauride and a condensed naphthalenesulfonate.

13. The developer as claimed in claim 12, wherein said alkali is sodium.

14. The developer as claimed in claim 1, wherein said at least one organic solvent is selected from the group consisting of benzyl alcohol, ethylene glycol monophenyl ether, 1-phenylethanol, 2-phenylethanol and propylene glycol monomethyl ether.

15. The developer as claimed in claim 1, wherein said at least one emulsifier is selected from the group consisting of poly-N-vinyl-N-methylacetamide, a water-soluble copolymer of N-vinyl-N-methylacetamide, polyvinyl alcohol, dextrine, gum arabic and a cellulose ether.

16. The developer as claimed in claim 15, wherein said cellulose ether is carboxymethylcellulose.

17. The developer as claimed in claim 1, wherein said buffer is selected from the group consisting of a carbonate, a phosphate, a borate, and an alkali metal salt of glycine and anamine, and combinations of the above.

18. The developer as claimed in claim 17, wherein said amine is selected from a diethanolamine and a triethanolamine.

* * * * *